(12) United States Patent
Frenzel et al.

(10) Patent No.: US 7,268,957 B2
(45) Date of Patent: Sep. 11, 2007

(54) OPTICAL MODULE AND OPTICAL SYSTEM

(75) Inventors: Henryk Frenzel, Regensburg (DE); Harald Schmidt, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/573,542

(22) PCT Filed: May 11, 2004

(86) PCT No.: PCT/EP2004/050755

§ 371 (c)(1),
(2), (4) Date: Mar. 27, 2006

(87) PCT Pub. No.: WO2005/031878

PCT Pub. Date: Apr. 7, 2005

(65) Prior Publication Data

US 2006/0222300 A1    Oct. 5, 2006

(30) Foreign Application Priority Data

Sep. 26, 2003 (DE) ............................ 103 44 768

(51) Int. Cl.
*G02B 7/02* (2006.01)
(52) U.S. Cl. .................. 359/811; 359/819; 359/813
(58) Field of Classification Search ........... 359/811, 359/813, 819, 821, 822, 823, 827, 829
See application file for complete search history.

(56) References Cited

U.S. PATENT DOCUMENTS 3,954,338 A    5/1976 Hennel et al.
4,431,267 A    2/1984 Finck et al.
2006/0202106 A1* 9/2006 Nishikawa et al. ...... 250/208.1

FOREIGN PATENT DOCUMENTS

| DE | 196 51 260 A1 | 1/1998 |
| DE | 199 34 183 A1 | 1/2001 |
| EP | 0 286 172 A1 | 4/1988 |
| EP | 0 911 662 A2 | 4/1999 |
| EP | 1 134 601 A2 | 9/2001 |
| EP | 1 220 324 A2 | 7/2002 |

* cited by examiner

*Primary Examiner*—Timothy Thompson
(74) *Attorney, Agent, or Firm*—Laurence A. Greenberg; Werner H. Stemer; Ralph E. Locher

(57) ABSTRACT

An optical module has a lens holder into which a lens array with three lenses and a diaphragm, for example, is inserted. The lenses and the diaphragm are oriented by way of the geometrical shape thereof such that no further optical adjustment is required. The circuit carrier and the lens unit are adjusted via at least one permanently flexible or springy element which is disposed between the lens holder and the circuit carrier and presses the component-equipped area of the circuit carrier away from the lens holder and against at least one stop element that is in positive contact with the lens unit. In the novel optical module or optical system it is no longer necessary to take into account the thickness tolerance of the circuit carrier and possible adhesives in the tolerance chain of optical modules. The module and the system are particularly suitable interior or exterior zone applications in motor vehicles.

14 Claims, 4 Drawing Sheets

OPTICAL MODULE AND OPTICAL SYSTEM

BACKGROUND OF THE INVENTION

Field of the Invention

The invention relates to an optical module with a rigid circuit carrier comprising a component-equipped area; an unpackaged semiconductor element arranged by means of flip-chip technology on the component-equipped area of the circuit carrier and a lens unit which is arranged on the side facing away from the component-equipped side of the circuit carrier; with the circuit carrier featuring an opening through which electromagnetic radiation is projected from the lens unit onto the semiconductor element; and with the lens unit comprising a lens holder and a lens arrangement with at least one lens. Generic optical modules are known for example from DE 196 51 260 A1.

The invention further relates to an optical system with such an optical module.

Generic optical modules and systems are used especially in automotive technology. In such cases operation can be with electromagnetic radiation from different frequency ranges, in which case cumulatively to the visible light, with which applications in the exterior area of a motor vehicle typically operate, such as LDW (Lane Departure Warning), BSD (Blind Spot Detection), or (Rear View Cameras), the infrared light which is invisible to the human eye is preferred for applications in the interior of the motor vehicle such as OOP (Out of Position Detection) or for additional outside illumination of a night vision system.

High demands are imposed on applications in the interior and exterior area of a vehicle as a result of external influences such as temperature, moisture, contamination and vibration. The typical lifetime for systems in the motor vehicle is around 10 to 15 years, with only extremely low failure rates being tolerated, so that the components of an optical system of the type mentioned at the start may only exhibit very slow ageing.

Since in many cases the space for installing optical modules or optical systems is very restricted, additional difficulties arise in implementing the optical systems. It is thus extremely difficult using conventional means to construct a hermetically sealed reliable unit consisting of a camera chip (currently CCD or CMOS sensors) and optics.

Thus with these types of systems, with which images or similar information are recorded, it is obviously necessary for the optics to have their precise focus at the point at which light is converted into information (e.g. film plane, optical surface of CCD or CMOS sensor). The distance between the camera chip and the optics must therefore either be basically set and fixed once during manufacturing, or the focus is reset for each image (focusing on object, non-concretive rays). This makes such units very expensive to manufacture. Furthermore a quality risk arises as a result.

However cameras for specific low-cost applications such as automotive, industry, digital cameras, mobiles, toys etc. should be manufactured where possible, as regards cost and quality assurance aspects, without adjustment procedures between optics and camera chip, that is without making adjustments to the focus on the optical surface of the CMOS or CCD sensor. This basically conflicts with the stated requirements.

One possibility for developing a focus-free system is to reduce the sums of the possible tolerances and elements, so that the module or system functions as a result of the design without adjustment in at least one specific distance and temperature range. Where the invention is used for example within the framework of an occupant protection system of a motor vehicle, to which the present invention is however not restricted, sharper images at distances of for example 15 cm to 130 cm as well as at temperatures of for example −40° C. to +105° C. should be able to be guaranteed. The fewer elements are included in the tolerance chain, the easier this is to implement. A major proportion of the tolerance chain is taken up by the circuit carrier for the camera chip (e.g. CCD or CMOS). Thus for example by using very thin, so-called flexible circuit boards, an attempt is made to include only a very small thickness tolerance. In addition the required solder and if necessary glued connections or such like between the chip and the circuit carrier constitute a large element in the tolerance chain.

Using only one lens avoids additional optical tolerances being caused by a complicated lens construction. The lens holder, which is preferably made of plastic and can itself be linked to the lens arrangement in a different way so that an exact optical alignment of the lens arrangement and of the semiconductor element in relation to the lens holder or the lens arrangement respectively can always be ensured.

However with systems which largely feature a classical layout consisting of lens and camera chip, with the camera chip being accommodated unpackaged as what is referred to as a flip-chip on a suitable circuit carrier, it is difficult to get around the given overall problems and simultaneously meet the given quality requirements. The lens itself must however be adjusted to the camera chip and feature a defined focusing. This is done by suitable fixing options, for example by screwing, gluing or such like, by means of which the lens is fixed relative to the camera chip to the opposite side of the circuit carrier from the component-equipped surface so that the circuit carrier as well as the adhesive or the screw connection or such like are disadvantageously included in the tolerance chain.

SUMMARY OF THE INVENTION

The object of the invention is to make available an optical module and an optical system with a semiconductor element arranged on a rigid circuit carrier in which the thickness tolerance of the necessary circuit carrier and look connections possibly required or suchlike are largely eliminated so that with a simple and cost-effective assembly, a reliable optical quality without adjustment and especially focusing effort can be provided and can be maintained over the lifetime of the module or system.

This object is achieved with the features of the independent claims. Advantageous embodiments of the invention, which can be used individually or in combination with each other, are specified in the dependent claims.

The invention builds on the generic optical module such that between the lens holder and the circuit carrier at least one permanently flexible or springy element is arranged which presses the component-equipped area of the circuit carrier away from the lens holder against at least one stop element that is in positive contact with the lens unit.

Unlike the solutions known from the prior art in which the circuit carrier is pressed against a lens holder, the present invention follows a new path whereby the circuit carrier is pressed in the opposite direction by a permanently flexible element, i.e. away from lens holder, and a stop there makes positive contact with the optics. In this way the entire tolerance of the circuit carrier and possible adhesives are not only largely but advantageously completely eliminated. Thus with the present invention a manufacturing technology with especially low tolerances between an unpackaged semiconductor element and a lens unit is made possible.

For example the positive contact is implemented by a positive-contact surface embodied on the stop element. In a first development, this can be part of a snap-on connection. To this end the stop element is preferably implemented by a hook embodied on the lens holder. This not only makes the assembly, but also subsequent recycling, especially the disassembly of optics and electronics, especially environmentally friendly and simple.

In an alternative development the stop element is part of a screwed or riveted connection or such like, with the stop element preferably being implemented by distance bolts or screw holes arranged on the lens holder which operate in conjunction with a screw, a plastic rivet for example or such like.

In accordance with the invention the permanently flexible or springy element is preferably rectangular in shape or annular in shape or such like, preferably embodied as a punched part. This advantageously allows the part to be mass produced.

For example permanently flexible or springy elements made from thermoplastic elastomers (TPE), Silicon or such like have proven themselves which preferably simultaneously seal the lens unit against the circuit carrier, especially to protect it against moisture and/or dust etc. In an especially advantageous manner the inventive optical module can be developed by providing a ventilation channel in the connection area between the rigid circuit board and the permanently flexible or springy element. This enables a sealed module to "breathe", especially in the event of large variations in temperature. In the embodiment of the present invention with a permanently flexible or springy element it is possible in a simple manner to incorporate a ventilation channel into the element itself for example. If the optical module is to be used where temperatures vary widely, it can prove sensible to glue an adhesive pressure equalization element or pressure equalization foil over an opening embodied in a flexible element, if necessary also in the lens holder itself.

Alternatively or cumulatively porous, permanently flexible or springy elements, especially embodied in foam rubber are of advantage, by means of which "breathing" of the lens can be implemented.

The invention finally consists of an optical system with an optical module of the type given above. In this way the advantages of the optical module can also be brought to bear within the framework of an overall system.

The invention is based on the knowledge that, unlike previous approaches to the solution, it is possible to press the circuit carrier by means of a permanently flexible or springy element in the opposite direction, i.e. away from the lens holder and against a stop which is in positive contact with the optics, so that a compact highly-integrated module solution with small dimensions is available and which at the same time is simple to assemble and to disassemble and is thereby especially cost-effective.

The optical module and the optical system are practically maintenance-free. Especially in the sense of cost saving it is also a fact that no optical adjustment of the optical module is required since this is provided in any event by the geometric design of the stop elements, in which case the tolerance chain is shortened by eliminating the circuit carrier and adhesive tolerance by a further amount. Only the tolerance of the stop element remains in the tolerance chain. This amount is however tool-associated. The optical module in accordance with the invention or the optical system is thus far better than previously known modules in respect of tolerances.

The invention can be employed especially usefully in the implementation of video systems, if necessary in combination with radar systems, ultrasound systems or such like in the automotive area.

The invention is now explained with reference to the accompanying drawings on the basis of preferred embodiments.

DESCRIPTION OF THE PREFERRED EMBODIMENTS

In the description of the preferred embodiment of the present invention below the same reference symbols refer to the same or comparable components.

Figure 1:
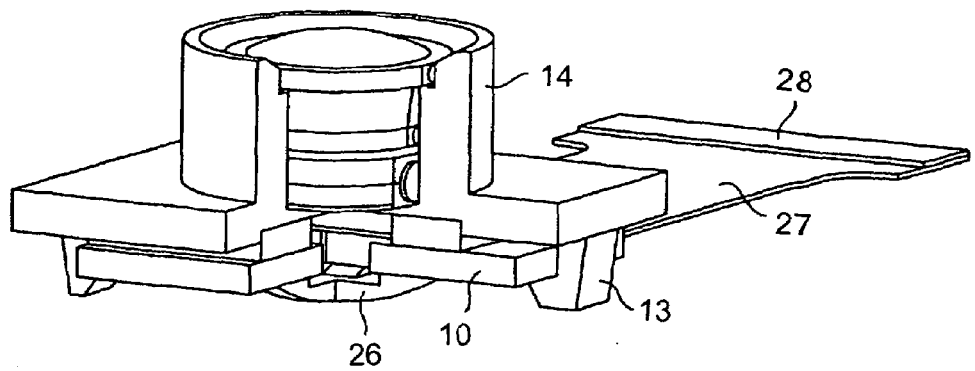
FIG. 1 a perspective part cross-sectional diagram of an inventive optical module.
Figure 2:
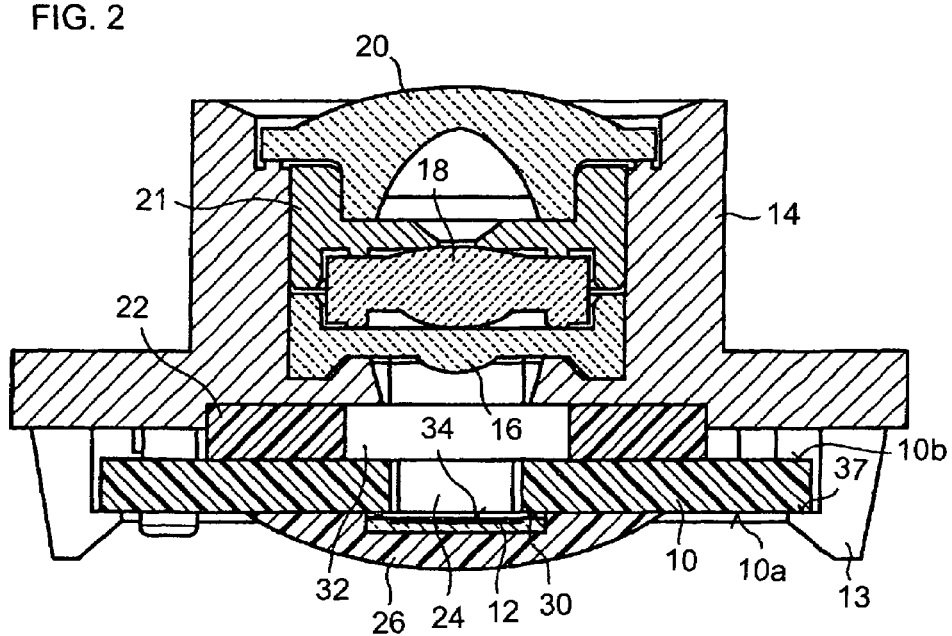
FIG. 2 a side view of the inventive optical module from FIG. 1.

A lens unit 14; 16, 18, 20; 21 and a rigid circuit board 10, comprising a component-equipped area 10*a* can be seen in the assembled state of the optical module shown in FIGS. 1 and 2. The rigidly embodied circuit board 10 shown forms the circuit carrier 10 for an unpackaged semiconductor element 12 sensitive to electromagnetic radiation, which is accommodated here as a flip chip 12, which has the advantage that there are no additional tolerances within the sensor or component (e.g. carrier chip, adhesive, etc.). The rigidly embodied circuit board 10 shown here is in effective contact with a ribbon cable or a flexible circuit board 27, with solder pads 28 being provided at the opposite ends of said cable, so that an electrical contact between the optical module and a circuit board (not shown), for example by iron soldering using the solder pads 28, can be established.

The semiconductor element 12 is disposed on the circuit carrier 10 via solder bumps 30. The semiconductor element 12 is disposed by flip-chip technology on the circuit carrier 10. So that electromagnetic radiation can reach the semiconductor element from the lens arrangement 16, 18, 20; 21 arranged on the side of the circuit board 10*b* facing away from the component-equipped area 10*a* of the circuit carrier 10, the rigid circuit carrier 10 features an opening 24. Likewise the permanently flexible or springy element 22 arranged between lens holder 14 and circuit carrier 10 or its second surface 10*b* has an opening 32. Through these openings electromagnetic radiation can reach a surface 34 of the semiconductor element 12 sensitive to electromagnetic radiation.

The semiconductor element 12 can be designed in accordance with the prior art as a CMOS or CCD for example. A glued connection can also be used in addition to the solder connection 30. For strengthening an underfill (not shown) can be applied. To protect the rear of the expensive semiconductor element 12 against outside light radiation and/or environmental influences, a globtop 26 can be provided. To permit ventilation of the optical module with temperature variations, especially strong ones, a groove (not shown) for ventilation can for example be provided in the flexible element 22. Likewise it is possible to arrange a glued pressure equalization element on an opening (not shown) in the flexible element 22 or in the lens holder 14.

Preferably a lens arrangement 14; 16, 18, 20; 21 with a number of lenses 16, 18, 20 and if necessary at least one diaphragm 21 is provided in the form of a package. The optical quality can be improved by a lens with a number of lenses, which is also possible within the framework of the present invention, especially since it is possible to work with fine tolerances here. The lenses 16, 18, 20 and the diaphragm 21 are formed so that they assume a defined position relative to one another within the lens holder 14. Furthermore at least one of the lenses 20 is designed so that this lens 20 (as for example shown in FIGS. 7 and 8) operates via locking means 38 in conjunction with the lens holder 14 and thus also assumes a defined position in relation to the lens holder 14 and finally in relation to a semiconductor element 12. In this way all lenses 16, 18, 20 or diaphragms 21 are adjusted in relation to the semiconductor element 12.

The circuit carrier 10 and lens unit 14; 16, 18, 20; 21 are adjusted in accordance with the invention using the at least one permanently flexible or springy element 22 between lens holder 14 and circuit carrier 10, which presses the component-equipped area 10a of the circuit carrier 10 away from the lens holder 14 against at least one stop element 13; 35, which is in positive contact with the lens unit 14; 16, 18, 20; 21.

Preferably a surface to make the positive contact 37 is formed for this purpose in the stop element 33; 35.

In the exemplary embodiment in accordance with FIGS. 1 and 2 the stop element 13 is for example part of a snap-in connection, which is implemented by a hook arranged on the lens holder 14. Said positive-contact surface 37 is embodied on the hook 13 such that the component-equipped surface 10a lies against this surface 37.

Figure 3:
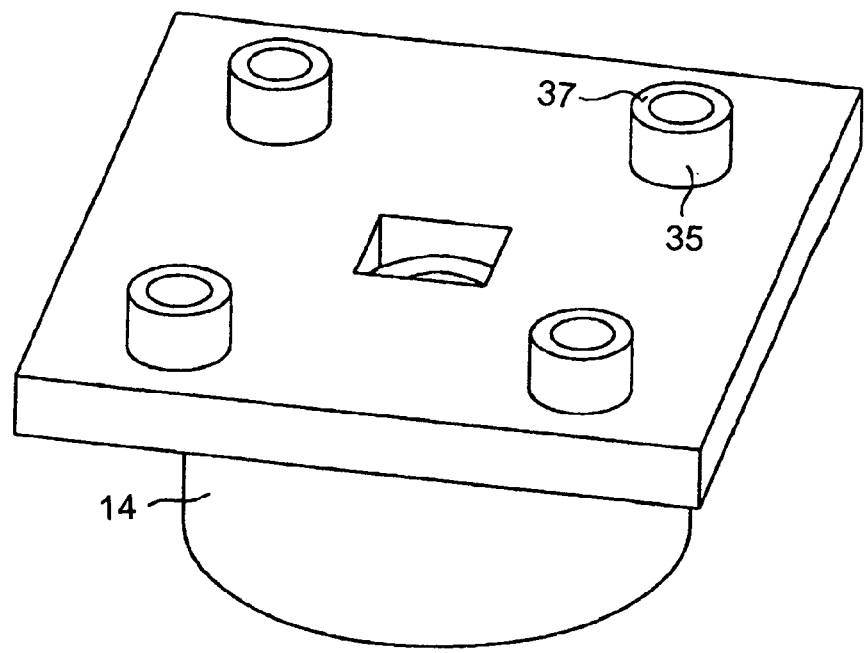
FIG. 3 the lens holder of an optical module in accordance with the invention with screw holes.

FIG. 3 shows an alternate exemplary embodiment in accordance with the invention. In this case the stop element 35 is part of a screwed or riveted connection, with spacer elements 35 being arranged on the lens holder 14 as a screw hole.

Figure 4:
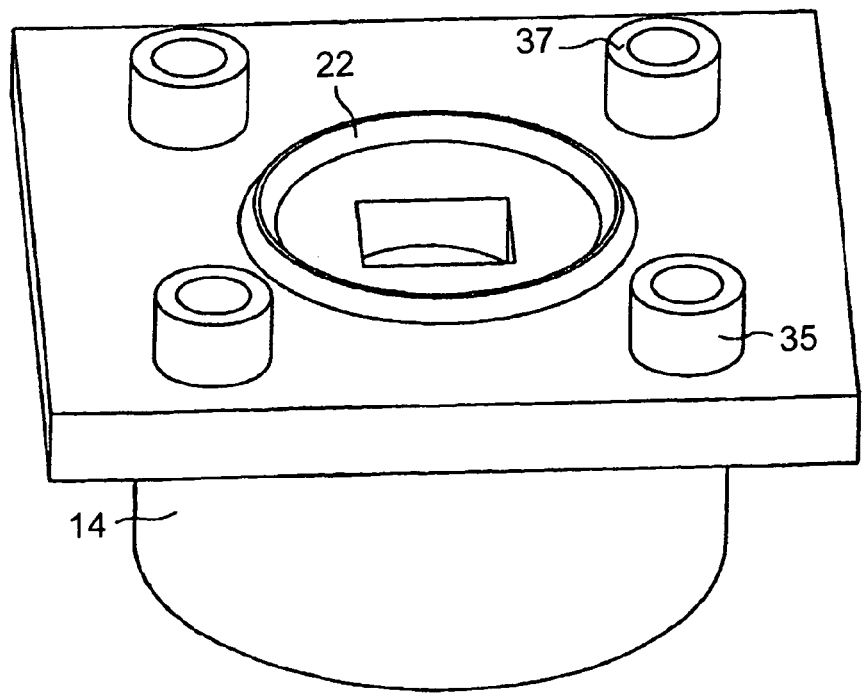
FIG. 4 the lens holder in accordance with FIG. 3 with a permanently flexible or springy annular element placed on it or formed into it.

FIG. 4 shows the lens holder 14 in accordance with FIG. 3 with an annular permanently flexible or springy element 22 being arranged on it. Depending on choice of material, the element 22 can also be formed for example by means of a two-component injection process or such like on the lens holder 14. It can be clearly seen how positive-contact surfaces 37 are formed on the end of the screw holes 35 facing away from the lens unit, the function is which is described below.

Figure 5:
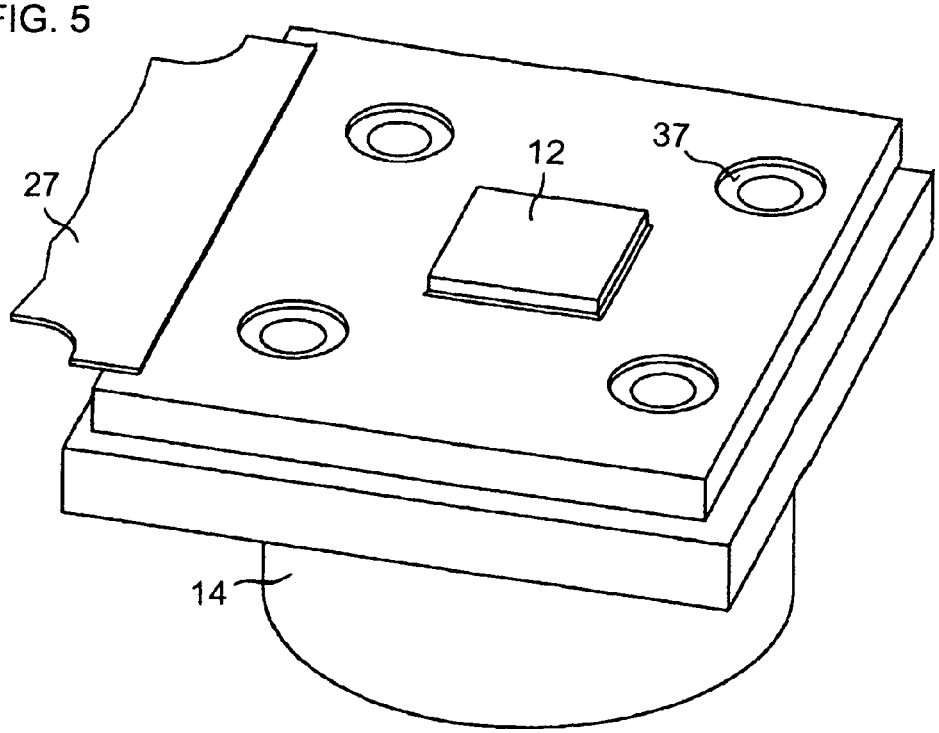
FIG. 5 the lens holder in accordance with FIG. 3 or 4 with a pre-positioned circuit carrier.

FIG. 5 shows the lens holder 14 in accordance with FIG. 3 or 4 with a pre-positioned rigid PCB circuit carrier 10, with this carrier 10 not yet making positive contact with the positive-contact surfaces 37 of the spacer elements 35. In other words—the circuit carrier 10 is not yet pushed downwards over the system onto the permanently flexible element 22.

Figure 6:
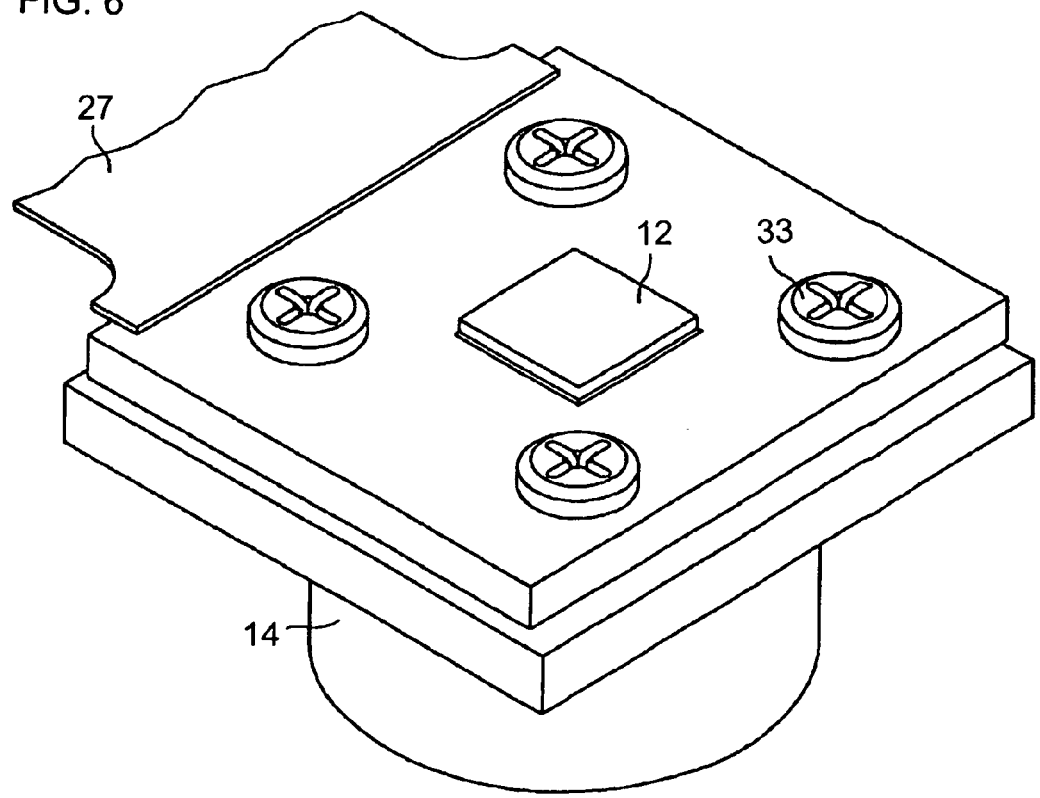
FIG. 6 the lens holder in accordance with FIG. 5 with a fixed circuit carrier.

FIG. 6 shows the lens holder 14 in accordance with FIG. 5 with a fixed PCB circuit carrier 10. Fixing elements such as screws 33, plastic rivets or similar elements are inserted into the spacer elements 35 until these fixing elements rest on the positive-contact surface 37. In this way the flip-chip surface or component-equipped surface 10a of the PCB circuit carrier is aligned in a defined way for the circuit carrier 10.

Figure 7:
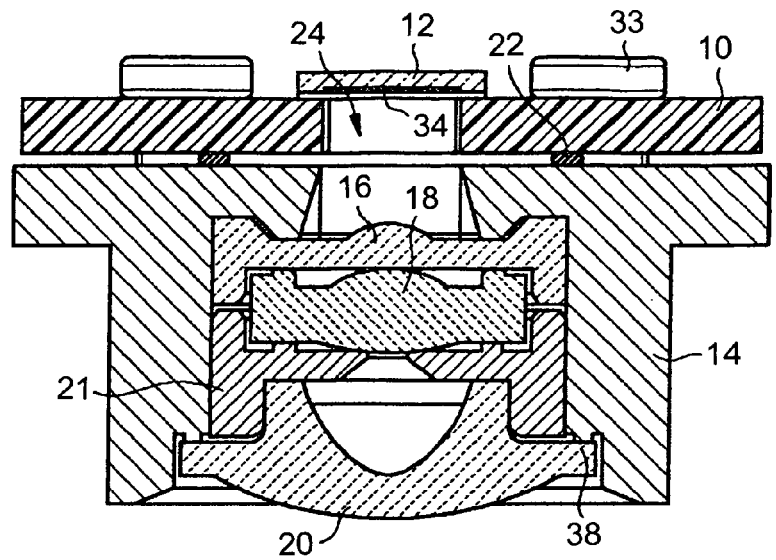
FIG. 7 a sectional diagram through the optical axis of an optical module in accordance with the invention.
Figure 8:
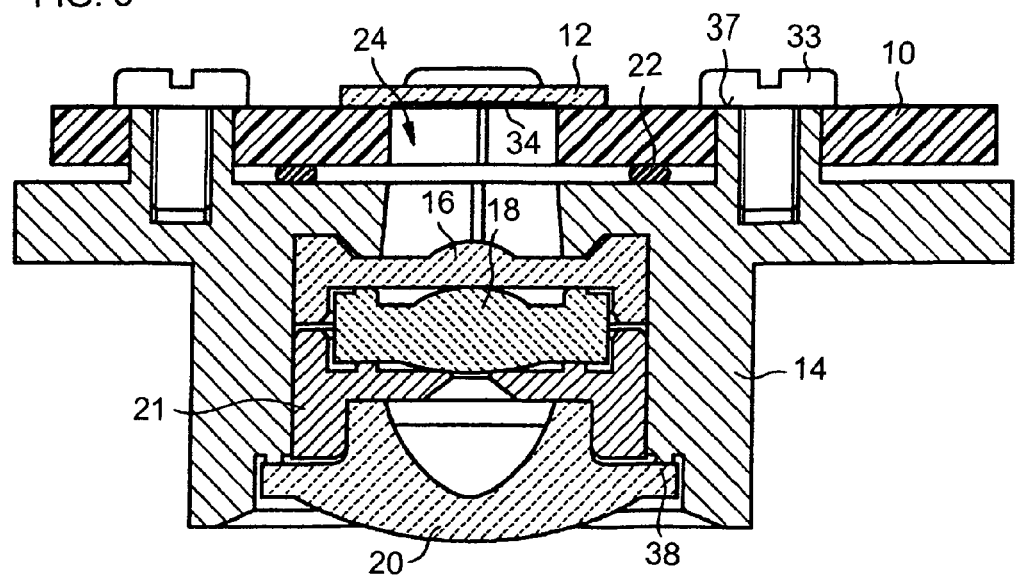
FIG. 8 a diagram of an optical module in accordance with the invention showing a cross section through the fixing.

FIG. 7 shows this in a diagram with a cross section through the optical axis and FIG. 8 in a diagram with a cross section through the fixing of the optical module in accordance with the invention. It can be clearly seen how the permanently flexible or springy element 22 presses the component-equipped surface 10a of the circuit carrier 10 against the fixing elements 33. In the prior art the circuit carrier has previously been pressed against a lens holder. The present invention now follows a new path whereby the circuit carrier is pressed by means of a permanently flexible or springy element 22 in the opposite direction, i.e. away from the lens holder 14 and a stop 13; 33, 35 there makes positive contact with the optics. In this way the entire tolerance of the circuit carrier 10 and possible adhesives are completely eliminated.

The present invention starts with an optical module with a lens unit which comprises a lens holder 14 in which a lens arrangement consisting for example of three lenses 16, 18, 20 and a diaphragm 21 is employed. Preferably the lenses 16, 18, 20 and the diaphragm 21 are uniquely aligned to each other and in relation to the lens holder 14 by their geometrical design so that no further optical adjustment of the optical module is necessary. The lens holder 14 is further connected via at least one stop element 13: 35 embodied on the lens holder 14 with the component-equipped area 10a of a rigidly embodied circuit board 10 which simultaneously acts as a circuit carrier for an unpackaged semiconductor element 12 sensitive to electromagnetic radiation so that for the first time the thickness tolerance of the circuit carrier 10 and any glued connections advantageously is not included in the tolerance chain of generic optical modules or systems. Since in accordance with the invention the semiconductor element 12 is arranged at a defined position in relation to the other optical elements, i.e. especially the lenses 16, 18, 20 or the diaphragm 21, the type of circuit carrier 10, e.g. FR4, CEM, etc. . . , no longer has to be fixed, as has previously been the case. Instead "normal", non-critical and thereby cheaper circuit carriers can be used.

The features of the invention disclosed in this description, in the drawings and in the claims can be of importance both individually and in any combination for implementing the invention. They are especially suitable for applications in the interior or exterior area of a motor vehicle.

We claim:

1. An optical module, comprising:
   a rigid circuit carrier formed with a component-equipped surface and an opposite surface;
   a non-packaged semiconductor element flip-chip-mounted on said component-equipped surface;
   a lens unit disposed on said opposite surface of said circuit carrier, said lens unit including a lens holder and a lens assembly with at least one lens;
   said circuit carrier having an opening formed therein for projecting therethrough electromagnetic radiation from said lens unit onto said semiconductor element;
   at least one permanently flexible or springy element disposed between said lens holder and said circuit carrier for biasing said component-equipped surface of said circuit carrier away from said lens holder and against at least one stop element forming a form-lock relationship with said lens unit.

2. The optical module according to claim 1, wherein said form-lock relationship is defined by positive-contact surface embodied on said stop element (13; 35).

3. The optical module according to claim 1, wherein said stop element forms part of a snap-on connection.

4. The optical module according to claim 3, wherein said stop element is formed by hooks disposed on said lens holder.

5. The optical module according to claim 1, wherein said stop element forms a part of a screw or rivet connection.

6. The optical module according to claim 5, wherein said stop element includes spacer bolts on said lens holder.

7. The optical module according to claim 5, wherein said stop element includes screw holes formed in said lens holder.

8. The optical module according to claim 1, wherein said permanently flexible or springy element has a rectangular or annular shape.

9. The optical module according to claim 8, wherein said permanently flexible or springy element is a punched part.

10. The optical module according to claim 1, wherein said permanently flexible or springy element contains thermoplastic elastomers (TPE) or silicon.

11. The optical module according to claim 1, wherein said permanently flexible or springy element is configured to seal said lens unit against said circuit carrier.

12. The optical module according to claim 1, wherein said permanently flexible or springy element is a porous sealing element.

13. The optical module according to claim 2, wherein said permanently flexible or springy element is formed of foam rubber.

14. An optical system, comprising at least one optical module according to claim 1.

* * * * *